(12) United States Patent
Sakurai et al.

(10) Patent No.: US 10,675,690 B2
(45) Date of Patent: Jun. 9, 2020

(54) HARD COATING AND HARD COATING-COVERED MEMBER

(71) Applicant: OSG CORPORATION, Toyokawa-shi, Aichi (JP)

(72) Inventors: Masatoshi Sakurai, Toyokawa (JP); Mei Wang, Toyokawa (JP); Hiroaki Sugita, Toyokawa (JP)

(73) Assignee: OSG CORPORATION, Toyokawa-shi (JP)

( * ) Notice: Subject to any disclaimer, the term of this patent is extended or adjusted under 35 U.S.C. 154(b) by 113 days.

(21) Appl. No.: 15/756,730

(22) PCT Filed: Sep. 4, 2015

(86) PCT No.: PCT/JP2015/075270
§ 371 (c)(1),
(2) Date: Mar. 1, 2018

(87) PCT Pub. No.: WO2017/037955
PCT Pub. Date: Mar. 9, 2017

(65) Prior Publication Data
US 2018/0243837 A1    Aug. 30, 2018

(51) Int. Cl.
*B32B 27/14*      (2006.01)
*B23B 27/14*      (2006.01)
(Continued)

(52) U.S. Cl.
CPC ............ *B23B 27/148* (2013.01); *B23B 51/00* (2013.01); *B23C 5/16* (2013.01); *C23C 14/024* (2013.01);
(Continued)

(58) Field of Classification Search
USPC ........... 51/307, 309; 407/119; 428/212, 216, 428/336, 697, 698, 699
See application file for complete search history.

(56) References Cited

U.S. PATENT DOCUMENTS 5,478,634 A * 12/1995 Setoyama ........... C03C 17/3435
                                                51/307
RE42,491 E      6/2011 Derflinger
(Continued)

FOREIGN PATENT DOCUMENTS

EP      0885984 A2      12/1998
EP      2 149 624 A1    2/2010
(Continued)

OTHER PUBLICATIONS

May 15, 2019 Chinese Office Action issued in Chinese Patent Application No. 201580082832.5.
(Continued)

*Primary Examiner* — Archene A Turner
(74) *Attorney, Agent, or Firm* — Oliff PLC

(57) ABSTRACT

A hard coating, which is to be disposed to cover a surface of a substrate, has a total thickness of 0.5-20 μm, and includes an A layer and nanolayer-alternated layer that are alternately laminated by physical vapor deposition. The nanolayer-alternated layer includes a B layer and a C layer that are alternately laminated. The A layer has a thickness of 50-1000 nm and is AlCr nitride that is represented by a composition formula of $[Al_{1-U}Cr_U]N$ wherein an atomic ratio U is 0.20-0.80. The B layer has a thickness of 1-100 nm and is TiAl nitride that is represented by a composition formula of $[Ti_{1-W}Al_W]N$ wherein an atomic ratio W is 0.30-0.85. The C layer has a thickness of 1-100 nm and is TiSi nitride that is represented by a composition formula of $[Ti_{1-Y}Si_Y]N$ wherein an atomic ratio Y is 0.05-0.45. The nanolayer-alternated layer has a thickness of 50-1000 nm.

11 Claims, 10 Drawing Sheets

(51) Int. Cl.
  *C23C 28/00* (2006.01)
  *C23C 14/32* (2006.01)
  *C23C 30/00* (2006.01)
  *C23C 28/04* (2006.01)
  *C23C 14/02* (2006.01)
  *B23B 51/00* (2006.01)
  *B23C 5/16* (2006.01)
  *C23C 14/06* (2006.01)

(52) U.S. Cl.
  CPC ........ *C23C 14/0641* (2013.01); *C23C 14/325* (2013.01); *C23C 28/04* (2013.01); *C23C 28/044* (2013.01); *C23C 28/42* (2013.01); *C23C 28/44* (2013.01); *C23C 30/005* (2013.01); *B23B 2228/08* (2013.01); *B23B 2228/10* (2013.01)

(56) References Cited

U.S. PATENT DOCUMENTS

| | | | |
|---|---|---|---|
| 8,409,695 B2* | 4/2013 | Ni | C23C 14/024 428/697 |
| 2006/0222893 A1 | 10/2006 | Derflinger | |
| 2008/0110749 A1 | 5/2008 | Krassnitzer et al. | |
| 2008/0131726 A1 | 6/2008 | Derflinger | |
| 2010/0012483 A1 | 1/2010 | Derflinger | |
| 2010/0215951 A1* | 8/2010 | Shibata | C23C 28/042 428/336 |
| 2011/0111193 A1 | 5/2011 | Lechthaler | |
| 2011/0171444 A1 | 7/2011 | Elkouby et al. | |
| 2012/0114436 A1* | 5/2012 | Andersson | C04B 41/009 407/119 |
| 2013/0071617 A1* | 3/2013 | Sjolen | C23C 14/0641 428/216 |
| 2014/0147683 A1* | 5/2014 | Arndt | C23C 14/0641 428/446 |
| 2015/0232978 A1 | 8/2015 | Schier | |
| 2016/0040279 A1 | 2/2016 | Setoyama et al. | |

FOREIGN PATENT DOCUMENTS

| | | |
|---|---|---|
| JP | 2008-534297 A | 8/2008 |
| JP | 2010-207916 A | 9/2010 |
| JP | 2011-167794 A | 9/2011 |
| JP | 2012-035377 A | 2/2012 |
| JP | 2012-035378 A | 2/2012 |
| JP | 2012-035380 A | 2/2012 |
| JP | 2012-061554 A | 3/2012 |
| JP | 2013-516331 A | 5/2013 |
| TW | 200801211 A | 1/2008 |
| TW | 201033390 A1 | 9/2010 |
| WO | 2013/000557 A1 | 1/2013 |
| WO | 2014/156447 A1 | 10/2014 |

OTHER PUBLICATIONS

Jan. 31, 2019 Extended European Search Report issued in European Patent Application No. 15903074.1.
Durand-Drouhin, O. et al., "Mechanical Properties and Failure Modes of TiAl(Si)N Single and Multilayer Thin Films.", Surface and Coatings Technology, vols. 163-164, pp. 260-266, (2003).
Nov. 2, 2015 International Search Report issued in Patent Application No. PCT/JP2015/075270.
Jul. 23, 2019 Office Action issued in Indian Patent Application No. 201837008262.
Feb. 27, 2020 Preliminary Office Action (Search Report) issued in Brazilian Patent Application No. 112018004352-4.

* cited by examiner

FIG.8

| COMPOSITION | A LAYER (at%) | | | | | | | | | |
|---|---|---|---|---|---|---|---|---|---|---|
| | Al | Cr | Si | V | Y | Zr | Nb | Mo | Ta | W |
| TEST SAMPLE 1 | 80 | 20 | | | | | | | | |
| TEST SAMPLE 2 | 20 | 80 | | | | | | | | |
| TEST SAMPLE 3 | 0 | 0 | | | | | | | | |
| TEST SAMPLE 4 | 100 | | | | | | | | | |
| TEST SAMPLE 5 | 0 | 0 | | | | | | | | |
| TEST SAMPLE 6 | 0 | 100 | | | | | | | | |
| TEST SAMPLE 7 | 80 | 20 | | | | | | | | |
| TEST SAMPLE 8 | 75 | 25 | | | | | | | | |
| TEST SAMPLE 9 | 65 | 35 | | | | | | | | |
| TEST SAMPLE 10 | 60 | 40 | | | | | | | | |
| TEST SAMPLE 11 | 50 | 50 | | | | | | | | |
| TEST SAMPLE 12 | 30 | 70 | | | | | | | | |
| TEST SAMPLE 13 | 20 | 80 | | | | | | | | |
| TEST SAMPLE 14 | 80 | 20 | | | | | | | | |
| TEST SAMPLE 15 | 25 | 75 | | | | | | | | |
| TEST SAMPLE 16 | 20 | 80 | | | | | | | | |
| TEST SAMPLE 17 | 50 | 50 | | | | | | | | |
| TEST SAMPLE 18 | 64.8 | 20 | 15.2 | | | | | | | |
| TEST SAMPLE 19 | 63.6 | 24.5 | 11.9 | | | | | | | |
| TEST SAMPLE 20 | 66 | 30 | 4 | | | | | | | |
| TEST SAMPLE 21 | 66 | 33.5 | 0.5 | | | | | | | |
| TEST SAMPLE 22 | 27.5 | 69 | 3.5 | | | | | | | |
| TEST SAMPLE 23 | 75 | 23 | | | 2 | | | | | |
| TEST SAMPLE 24 | 45 | 54.2 | | | 0.8 | | | | | |
| TEST SAMPLE 25 | 30 | 50 | | | 20 | | | | | |
| TEST SAMPLE 26 | 75 | 24.5 | | | | 0.5 | | | | |
| TEST SAMPLE 27 | 58.3 | 28 | | | | 13.7 | | | | |
| TEST SAMPLE 28 | 35 | 63.4 | | | | 1.6 | | | | |
| TEST SAMPLE 29 | 74.5 | 25.2 | | 0.3 | | | | | | |
| TEST SAMPLE 30 | 30.5 | 55 | | 14.5 | | | | | | |
| TEST SAMPLE 31 | 20 | 69 | 10 | 1 | | | | | | |
| TEST SAMPLE 32 | 46.9 | 50.2 | 0.5 | 2.4 | | | | | | |
| TEST SAMPLE 33 | 74.5 | 20 | | | | | 5.5 | | | |
| TEST SAMPLE 34 | 45.6 | 50.2 | | | | | 4.2 | | | |
| TEST SAMPLE 35 | 40.9 | 45 | | | | | | | 14.1 | |
| TEST SAMPLE 36 | 70.5 | 24.5 | | | | | | | 5 | |
| TEST SAMPLE 37 | 24.5 | 55.6 | | | | | | 19.9 | | |
| TEST SAMPLE 38 | 70.5 | 24.3 | | | | | | 5.2 | | |
| TEST SAMPLE 39 | 33 | 64.2 | | | | | | 0.3 | 2.5 | |
| TEST SAMPLE 40 | 69.8 | 20 | | | | | | 9.7 | 0.5 | |
| TEST SAMPLE 41 | 65 | 28 | 5 | | | | | 2 | | |
| TEST SAMPLE 42 | 30.5 | 64.4 | 2.5 | | | | | | 2.6 | |
| TEST SAMPLE 43 | 65.4 | 29 | 3.2 | | | | | | 2.4 | |
| TEST SAMPLE 44 | 30 | 55.3 | 2.5 | | | | | | 12.2 | |
| TEST SAMPLE 45 | 20 | 63.5 | 10 | 5.1 | | | | | 1.4 | |
| TEST SAMPLE 46 | 20 | 77 | | | | | | | | 3 |
| TEST SAMPLE 47 | 35 | 63 | | | | | | | | 2 |
| TEST SAMPLE 48 | 67 | 30.5 | | | | | | | | 2.5 |
| TEST SAMPLE 49 | 70 | 21 | | | | | | | 5 | 4 |
| TEST SAMPLE 50 | 35 | 64 | | | | | | 0.5 | | 0.5 |

FIG.9

| COMPOSITION | B LAYER(at%) | | | | | | | | | | | |
|---|---|---|---|---|---|---|---|---|---|---|---|---|
| | Ti | Al | B | C | V | Cr | Zr | Nb | Mo | Hf | Ta | W |
| TEST SAMPLE 1 | 0 | 0 | | | | | | | | | | |
| TEST SAMPLE 2 | 60 | 40 | | | | | | | | | | |
| TEST SAMPLE 3 | 30 | 70 | | | | | | | | | | |
| TEST SAMPLE 4 | 40 | 60 | | | | | | | | | | |
| TEST SAMPLE 5 | 80 | 20 | | | | | | | | | | |
| TEST SAMPLE 6 | 10 | 90 | | | | | | | | | | |
| TEST SAMPLE 7 | 45 | 55 | | | | | | | | | | |
| TEST SAMPLE 8 | 15 | 85 | | | | | | | | | | |
| TEST SAMPLE 9 | 30 | 70 | | | | | | | | | | |
| TEST SAMPLE 10 | 40 | 60 | | | | | | | | | | |
| TEST SAMPLE 11 | 50 | 50 | | | | | | | | | | |
| TEST SAMPLE 12 | 65 | 35 | | | | | | | | | | |
| TEST SAMPLE 13 | 55 | 45 | | | | | | | | | | |
| TEST SAMPLE 14 | 20 | 80 | | | | | | | | | | |
| TEST SAMPLE 15 | 40 | 60 | | | | | | | | | | |
| TEST SAMPLE 16 | 45 | 55 | | | | | | | | | | |
| TEST SAMPLE 17 | 15 | 85 | | | | | | | | | | |
| TEST SAMPLE 18 | 30 | 70 | | | | | | | | | | |
| TEST SAMPLE 19 | 69 | 30 | | | | 1.5 | | | | | | |
| TEST SAMPLE 20 | 65 | 30 | | | | 5 | | | | | | |
| TEST SAMPLE 21 | 15 | 83.5 | | | | 1.5 | | | | | | |
| TEST SAMPLE 22 | 70 | 30 | 0.1 | | | | | | | | | |
| TEST SAMPLE 23 | 45 | 45 | 10 | | | | | | | | | |
| TEST SAMPLE 24 | 15 | 80 | 5 | | | | | | | | | |
| TEST SAMPLE 25 | 35 | 58 | | 7 | | | | | | | | |
| TEST SAMPLE 26 | 38 | 60 | | 2 | | | | | | | | |
| TEST SAMPLE 27 | 68 | 30 | | | 2 | | | | | | | |
| TEST SAMPLE 28 | 65 | 30 | | | 5.5 | | | | | | | |
| TEST SAMPLE 29 | 15 | 82.6 | | | 2.4 | | | | | | | |
| TEST SAMPLE 30 | 35 | 56.3 | | | | | 8.7 | | | | | |
| TEST SAMPLE 31 | 41.9 | 51.1 | | | | | 7 | | | | | |
| TEST SAMPLE 32 | 68.4 | 31.5 | | | | | 0.1 | | | | | |
| TEST SAMPLE 33 | 25 | 67 | | | | 0.5 | 7.5 | | | | | |
| TEST SAMPLE 34 | 15 | 80 | | | | 4.5 | 0.5 | | | | | |
| TEST SAMPLE 35 | 20 | 70.2 | | | | | | 9.8 | | | | |
| TEST SAMPLE 36 | 68 | 30.5 | | | | | | 2 | | | | |
| TEST SAMPLE 37 | 42 | 45 | | | | 5 | | 8 | | | | |
| TEST SAMPLE 38 | 30 | 68 | | | | | | | 2 | | | |
| TEST SAMPLE 39 | 56 | 41.3 | | | | | | | 2.7 | | | |
| TEST SAMPLE 40 | 39 | 54.5 | | | | | | | | 6.5 | | |
| TEST SAMPLE 41 | 32 | 62.5 | | | | | | | | | 5.5 | |
| TEST SAMPLE 42 | 36 | 61 | | | | | | | | | 3 | |
| TEST SAMPLE 43 | 40 | 55.4 | | | | | | | | | | 4.6 |
| TEST SAMPLE 44 | 60 | 35 | | | | | | | | | | 5 |
| TEST SAMPLE 45 | 68 | 30 | | | | | | | | | | 2 |
| TEST SAMPLE 46 | 55 | 35 | | | | | | | 8 | | | 2 |
| TEST SAMPLE 47 | 15 | 77 | | | | | 4 | | | | | 4 |
| TEST SAMPLE 48 | 50 | 44.8 | | | | | | | | 0.5 | | 4.7 |
| TEST SAMPLE 49 | 40 | 50.8 | | | | | | | | 0.8 | 5 | 3.4 |
| TEST SAMPLE 50 | 58 | 30 | | 0.5 | | | | | 1.5 | | | 10 |

FIG.10

| COMPOSITION | C LAYER(at%) | | | | | | | | |
|---|---|---|---|---|---|---|---|---|---|
| | Ti | Si | B | C | V | Y | Nb | Mo | W |
| TEST SAMPLE 1 | 80 | 20 | | | | | | | |
| TEST SAMPLE 2 | 0 | 0 | | | | | | | |
| TEST SAMPLE 3 | 55 | 45 | | | | | | | |
| TEST SAMPLE 4 | 95 | 5 | | | | | | | |
| TEST SAMPLE 5 | 85 | 15 | | | | | | | |
| TEST SAMPLE 6 | 55 | 45 | | | | | | | |
| TEST SAMPLE 7 | 85 | 15 | | | | | | | |
| TEST SAMPLE 8 | 80 | 20 | | | | | | | |
| TEST SAMPLE 9 | 60 | 40 | | | | | | | |
| TEST SAMPLE 10 | 85 | 15 | | | | | | | |
| TEST SAMPLE 11 | 80 | 20 | | | | | | | |
| TEST SAMPLE 12 | 75 | 25 | | | | | | | |
| TEST SAMPLE 13 | 65 | 35 | | | | | | | |
| TEST SAMPLE 14 | 55 | 45 | | | | | | | |
| TEST SAMPLE 15 | 55 | 44.5 | | | | 0.5 | | | |
| TEST SAMPLE 16 | 94.5 | 5 | | | | 0.5 | | | |
| TEST SAMPLE 17 | 85 | 5 | | | | 10.0 | | | |
| TEST SAMPLE 18 | 85 | 13.5 | | | | 1.5 | | | |
| TEST SAMPLE 19 | 90 | 5.5 | | | 4.5 | | | | |
| TEST SAMPLE 20 | 85.3 | 14.2 | | | 0.5 | | | | |
| TEST SAMPLE 21 | 91.5 | 5 | | | 3.5 | | | | |
| TEST SAMPLE 22 | 80.2 | 15.2 | | | 4.6 | | | | |
| TEST SAMPLE 23 | 93.5 | 5.0 | | | | | 1.5 | | |
| TEST SAMPLE 24 | 60 | 35.0 | | | | | 5 | | |
| TEST SAMPLE 25 | 55 | 44.5 | | | | | 0.5 | | |
| TEST SAMPLE 26 | 85.5 | 12.5 | | | | | 2 | | |
| TEST SAMPLE 27 | 80.8 | 9.2 | | | | | 10 | | |
| TEST SAMPLE 28 | 72.3 | 27.5 | | | | | 0 | | |
| TEST SAMPLE 29 | 55 | 42 | | | 1.5 | | 2 | | |
| TEST SAMPLE 30 | 85 | 14 | | | | | | | 1 |
| TEST SAMPLE 31 | 55 | 35.0 | | | | | | | 10 |
| TEST SAMPLE 32 | 79 | 20.5 | | | | | | | 0.5 |
| TEST SAMPLE 33 | 66.8 | 32.5 | | | | | | 1 | 0.2 |
| TEST SAMPLE 34 | 55 | 44.5 | 0.5 | | | | | | |
| TEST SAMPLE 35 | 76.4 | 13.6 | 10.0 | | | | | | |
| TEST SAMPLE 36 | 65.8 | 29.3 | 4.9 | | | | | | |
| TEST SAMPLE 37 | 81.2 | 18.7 | | 0.1 | | | | | |
| TEST SAMPLE 38 | 90.5 | 5.5 | | 4 | | | | | |
| TEST SAMPLE 39 | 90 | 5 | | 1.5 | | | | | 3.5 |
| TEST SAMPLE 40 | 85.3 | 5 | | 9.2 | | | | | 0.5 |
| TEST SAMPLE 41 | 85 | 12.5 | | 2.5 | | | | | |
| TEST SAMPLE 42 | 94.1 | 5 | | 0.9 | | | | | |
| TEST SAMPLE 43 | 56 | 42.9 | | 1.1 | | | | | |
| TEST SAMPLE 44 | 80.6 | 9.5 | | 9.9 | | | | | |
| TEST SAMPLE 45 | 85 | 5.5 | | 9.5 | | | | | |
| TEST SAMPLE 46 | 70 | 20 | | 6 | | | 4 | | |
| TEST SAMPLE 47 | 55 | 40.4 | | 0.6 | | | | 4 | |
| TEST SAMPLE 48 | 68 | 15 | | | 10 | 7 | | | |
| TEST SAMPLE 49 | 63.4 | 24 | | | | 5.5 | 7.1 | | |
| TEST SAMPLE 50 | 75 | 15 | | | | | | | 10 |

FIG.11

| COMPOSITION | FILM THICKNESS | | | | | | | |
|---|---|---|---|---|---|---|---|---|
| | A LAYER (nm) | B LAYER (nm) | C LAYER (nm) | NUMBER OF PAIRS OF LAMINATED B & C LAYERS | NANOLAYER-ALTERNATED LAYER (nm) | INTERFACE LAYER (nm) | NUMBER OF PAIRS OF LAMINATED A & NANOLAYER-ALTERNATED LAYERS | TOTAL THICKNESS ($\mu$m) |
| TEST SAMPLE 1 | 600 | 0.0 | 2000 | 15 | 30000 | 1300 | 1 | 31.9 |
| TEST SAMPLE 2 | 1500 | 10 | 20 | 10 | 300 | 30 | 4 | 7.2 |
| TEST SAMPLE 3 | 0 | 200 | 300 | 3 | 1500 | 40 | 16 | 24.1 |
| TEST SAMPLE 4 | 30 | 50 | 20 | 3 | 210 | 1200 | 20 | 16.8 |
| TEST SAMPLE 5 | 0 | 0.5 | 1 | 10 | 15 | 40 | 150 | 2.7 |
| TEST SAMPLE 6 | 40 | 0.5 | 0.5 | 12 | 12 | 35 | 1 | 0.4 |
| TEST SAMPLE 7 | 50 | 2 | 3 | 10 | 50 | 50 | 199 | 20.0 |
| TEST SAMPLE 8 | 400 | 30 | 12 | 5 | 210 | 100 | 12 | 7.4 |
| TEST SAMPLE 9 | 600 | 3 | 3 | 67 | 402 | 200 | 16 | 16.2 |
| TEST SAMPLE 10 | 400 | 100 | 25 | 6 | 750 | 50 | 11 | 12.7 |
| TEST SAMPLE 11 | 1000 | 80 | 10 | 9 | 810 | 1000 | 3 | 6.4 |
| TEST SAMPLE 12 | 350 | 2 | 2 | 15 | 53 | 500 | 12 | 5.3 |
| TEST SAMPLE 13 | 550 | 3 | 4 | 14 | 98 | 90 | 25 | 16.3 |
| TEST SAMPLE 14 | 850 | 5 | 1 | 17 | 102 | 1000 | 5 | 5.8 |
| TEST SAMPLE 15 | 1000 | 100 | 100 | 3 | 600 | 200 | 2 | 3.1 |
| TEST SAMPLE 16 | 200 | 2 | 1 | 17 | 51 | 200 | 44 | 11.2 |
| TEST SAMPLE 17 | 200 | 3 | 1 | 14 | 56 | 50 | 35 | 9.0 |
| TEST SAMPLE 18 | 250 | 5 | 1 | 9 | 54 | 60 | 15 | 4.6 |
| TEST SAMPLE 19 | 300 | 10 | 2 | 7 | 84 | 70 | 15 | 5.8 |
| TEST SAMPLE 20 | 400 | 2 | 3 | 12 | 60 | 50 | 20 | 9.3 |
| TEST SAMPLE 21 | 600 | 6 | 4 | 6 | 60 | 100 | 15 | 10.0 |
| TEST SAMPLE 22 | 1000 | 3 | 3 | 10 | 60 | 200 | 3 | 3.4 |
| TEST SAMPLE 23 | 980 | 12 | 4 | 15 | 240 | 300 | 3 | 4.0 |
| TEST SAMPLE 24 | 450 | 20 | 20 | 10 | 400 | 500 | 2 | 2.2 |
| TEST SAMPLE 25 | 50 | 1 | 1 | 25 | 50 | 50 | 4 | 0.5 |
| TEST SAMPLE 26 | 990 | 100 | 50 | 6 | 900 | 200 | 2 | 4.4 |
| TEST SAMPLE 27 | 1000 | 7 | 3 | 100 | 1000 | 350 | 2 | 4.0 |
| TEST SAMPLE 28 | 820 | 6 | 4 | 100 | 1000 | 400 | 2 | 3.9 |
| TEST SAMPLE 29 | 1000 | 18 | 9 | 35 | 945 | 550 | 2 | 4.2 |
| TEST SAMPLE 30 | 990 | 12 | 8 | 43 | 860 | 1000 | 5 | 10.3 |
| TEST SAMPLE 31 | 870 | 65 | 100 | 6 | 990 | 50 | 7 | 13.1 |
| TEST SAMPLE 32 | 940 | 15 | 20 | 12 | 420 | 200 | 6 | 8.4 |
| TEST SAMPLE 33 | 920 | 50 | 50 | 9 | 900 | 350 | 3 | 5.8 |
| TEST SAMPLE 34 | 850 | 15 | 30 | 17 | 765 | 450 | 4 | 6.9 |
| TEST SAMPLE 35 | 750 | 10 | 4 | 36 | 504 | 900 | 2 | 3.3 |
| TEST SAMPLE 36 | 50 | 1 | 2 | 17 | 51 | 50 | 4 | 0.5 |
| TEST SAMPLE 37 | 400 | 7 | 3 | 35 | 350 | 250 | 12 | 9.3 |
| TEST SAMPLE 38 | 450 | 15 | 5 | 15 | 300 | 50 | 6 | 4.6 |
| TEST SAMPLE 39 | 810 | 20 | 10 | 9 | 270 | 1000 | 9 | 10.7 |
| TEST SAMPLE 40 | 480 | 30 | 20 | 6 | 300 | 50 | 8 | 6.3 |
| TEST SAMPLE 41 | 400 | 50 | 5 | 9 | 495 | 300 | 22 | 20.0 |
| TEST SAMPLE 42 | 400 | 60 | 20 | 3 | 240 | 150 | 10 | 6.6 |
| TEST SAMPLE 43 | 400 | 100 | 50 | 1 | 150 | 100 | 8 | 4.5 |
| TEST SAMPLE 44 | 1000 | 50 | 100 | 5 | 750 | 200 | 3 | 5.5 |
| TEST SAMPLE 45 | 1000 | 30 | 50 | 8 | 640 | 200 | 3 | 5.1 |
| TEST SAMPLE 46 | 450 | 5 | 5 | 5 | 50 | 80 | 15 | 7.6 |
| TEST SAMPLE 47 | 820 | 10 | 15 | 40 | 1000 | 150 | 8 | 14.7 |
| TEST SAMPLE 48 | 100 | 20 | 5 | 2 | 50 | 500 | 14 | 2.6 |
| TEST SAMPLE 49 | 1000 | 40 | 10 | 7 | 350 | 500 | 5 | 7.3 |
| TEST SAMPLE 50 | 590 | 50 | 1 | 9 | 459 | 300 | 7 | 7.6 |

FIG.12

| COMPOSITION | COATING HARDNESS (HV0.025) | WEAR WIDTH (mm) *1 | CUTTING DISTANCE (m) *2 | JUDGMENT *3 | REMARK |
|---|---|---|---|---|---|
| TEST SAMPLE 1 | 2720 | 0.345 | 48.3 | × | COMPARATIVE EXAMPLE |
| TEST SAMPLE 2 | 2200 | 0.365 | 30.5 | × | COMPARATIVE EXAMPLE |
| TEST SAMPLE 3 | 2360 | 0.289 | 27.8 | × | COMPARATIVE EXAMPLE |
| TEST SAMPLE 4 | 2100 | 0.335 | 28.3 | × | COMPARATIVE EXAMPLE |
| TEST SAMPLE 5 | 2700 | 0.351 | 42.6 | × | COMPARATIVE EXAMPLE |
| TEST SAMPLE 6 | 2450 | 0.441 | 35.3 | × | COMPARATIVE EXAMPLE |
| TEST SAMPLE 7 | 2990 | 0.189 | 87.3 | ○ | EMBODIMENT |
| TEST SAMPLE 8 | 3047 | 0.139 | 112.3 | ○ | EMBODIMENT |
| TEST SAMPLE 9 | 3110 | 0.124 | 117.6 | ○ | EMBODIMENT |
| TEST SAMPLE 10 | 3100 | 0.110 | 135.9 | ○ | EMBODIMENT |
| TEST SAMPLE 11 | 3320 | 0.094 | 121 | ○ | EMBODIMENT |
| TEST SAMPLE 12 | 3200 | 0.163 | 112 | ○ | EMBODIMENT |
| TEST SAMPLE 13 | 3450 | 0.189 | 110 | ○ | EMBODIMENT |
| TEST SAMPLE 14 | 3120 | 0.144 | 132 | ○ | EMBODIMENT |
| TEST SAMPLE 15 | 3120 | 0.143 | 188.2 | ○ | EMBODIMENT |
| TEST SAMPLE 16 | 3310 | 0.139 | 140.9 | ○ | EMBODIMENT |
| TEST SAMPLE 17 | 3250 | 0.189 | 135.3 | ○ | EMBODIMENT |
| TEST SAMPLE 18 | 3110 | 0.084 | 134.3 | ○ | EMBODIMENT |
| TEST SAMPLE 19 | 3140 | 0.139 | 170.4 | ○ | EMBODIMENT |
| TEST SAMPLE 20 | 3250 | 0.122 | 200.1 | ○ | EMBODIMENT |
| TEST SAMPLE 21 | 3240 | 0.134 | 145.3 | ○ | EMBODIMENT |
| TEST SAMPLE 22 | 3240 | 0.187 | 139.4 | ○ | EMBODIMENT |
| TEST SAMPLE 23 | 3220 | 0.142 | 168.7 | ○ | EMBODIMENT |
| TEST SAMPLE 24 | 3190 | 0.099 | 159.2 | ○ | EMBODIMENT |
| TEST SAMPLE 25 | 3300 | 0.141 | 144.3 | ○ | EMBODIMENT |
| TEST SAMPLE 26 | 3250 | 0.124 | 132.2 | ○ | EMBODIMENT |
| TEST SAMPLE 27 | 3200 | 0.198 | 169.8 | ○ | EMBODIMENT |
| TEST SAMPLE 28 | 3260 | 0.193 | 144.5 | ○ | EMBODIMENT |
| TEST SAMPLE 29 | 3190 | 0.143 | 131.7 | ○ | EMBODIMENT |
| TEST SAMPLE 30 | 3250 | 0.158 | 120.3 | ○ | EMBODIMENT |
| TEST SAMPLE 31 | 3230 | 0.178 | 129.3 | ○ | EMBODIMENT |
| TEST SAMPLE 32 | 3260 | 0.138 | 121.3 | ○ | EMBODIMENT |
| TEST SAMPLE 33 | 3290 | 0.133 | 111.9 | ○ | EMBODIMENT |
| TEST SAMPLE 34 | 3270 | 0.122 | 119.3 | ○ | EMBODIMENT |
| TEST SAMPLE 35 | 3210 | 0.154 | 129.7 | ○ | EMBODIMENT |
| TEST SAMPLE 36 | 3250 | 0.143 | 170.3 | ○ | EMBODIMENT |
| TEST SAMPLE 37 | 3280 | 0.186 | 149.4 | ○ | EMBODIMENT |
| TEST SAMPLE 38 | 3290 | 0.093 | 113 | ○ | EMBODIMENT |
| TEST SAMPLE 39 | 3320 | 0.124 | 102.9 | ○ | EMBODIMENT |
| TEST SAMPLE 40 | 3270 | 0.134 | 113.5 | ○ | EMBODIMENT |
| TEST SAMPLE 41 | 3280 | 0.177 | 180.9 | ○ | EMBODIMENT |
| TEST SAMPLE 42 | 3280 | 0.152 | 179.2 | ○ | EMBODIMENT |
| TEST SAMPLE 43 | 3280 | 0.176 | 132.1 | ○ | EMBODIMENT |
| TEST SAMPLE 44 | 3260 | 0.168 | 168.9 | ○ | EMBODIMENT |
| TEST SAMPLE 45 | 3260 | 0.199 | 156.9 | ○ | EMBODIMENT |
| TEST SAMPLE 46 | 3340 | 0.135 | 145.5 | ○ | EMBODIMENT |
| TEST SAMPLE 47 | 3490 | 0.199 | 169.3 | ○ | EMBODIMENT |
| TEST SAMPLE 48 | 3320 | 0.179 | 155.9 | ○ | EMBODIMENT |
| TEST SAMPLE 49 | 3520 | 0.145 | 160.1 | ○ | EMBODIMENT |
| TEST SAMPLE 50 | 3440 | 0.159 | 176.8 | ○ | EMBODIMENT |

US 10,675,690 B2

HARD COATING AND HARD COATING-COVERED MEMBER

TECHNICAL FIELD

The present invention relates to a hard-coating-covered member having excellent heat resistance and excellent welding resistance, and more particularly to such a hard-coating-covered member excellent in the heat resistance and welding resistance and including an A layer of AlCr nitride and a nanolayer-alternated layer which are alternately laminated, wherein the nanolayer-alternated layer includes a B layer of TiAl nitride having a nano-order thickness and a C layer of TiSi nitride having a nano-order thickness which are alternately laminated.

BACKGROUND ART

Regarding various machining tools such as a cutting tool (e.g., drill, endmill, milling cutter, lathe cutter), a non-cutting tool (e.g., forming tap, rolling tool, press die) and also various tool members such as a friction part requiring wear resistance, there is proposed a technique of covering a surface of a substrate made of cemented carbide or high-speed tool steel, with a hard coating, for improving the wear resistance and durability.

On the other hand, in each of Patent Document 1 and Non-Patent Document 1, there is suggested a drill with a hard coating of TiAlN system/TiCrN system. In Patent Document 2, there is suggested a drill with a hard coating constituted by a multilayered structure of AlCrN system and TiSiN system.

PRIOR ART DOCUMENT

Patent Documents

[Patent Document 1] WO2013/000557
[Patent Document 2] JP2008-534297A

Non-Patent Documents

[Non-Patent Document 1] "Mechanical properties and failure models of TiAl(Si)N single and multilayer thin films" (authors: O. Durdnd-Drouhin, A. E. Santana, A. Karimi, V. H. Derflinger, A. Schutze) on pages 260-266 of "Surface and Coatings Technology" (Switzerland) Volumes 163-164, published by Elsevier Science in 2003

DISCLOSURE OF THE INVENTION

Object to be Achieved by the Invention

However, the drill described in each of the Patent Document 1 and Non-Patent Document 1 had a problem that the drill does not sufficiently provide wear resistance when being used to drill carbon steel or cast iron. The drill described in Patent Document 2 had a problem that the drill does not exhibit a sufficient performance when being used to drill alloy steel or stainless steel, since the drill does not sufficiently provide welding resistance.

The present invention was made in view of the background discussed above. It is therefore an object of the present invention to provide a hard-coating-covered tool which provides wear resistance when being used to cut carbon steel, cast iron or the like, and which provides welding resistance when being used to cut alloy steel, stainless steel or the like.

Various studies made by the inventors of the present invention under the above-described situation revealed a fact that a tool with a hard coating provides wear resistance when being used to cut carbon steel or cast iron and provides welding resistance when being used to cut alloy steel or stainless steel, wherein the hard coating includes an A layer made of AlCr nitride and a nanolayer-alternated layer are alternately arranged to have a total thickness not larger than 20 μm, and wherein the nanolayer-alternated layer includes a B layer made of TiAl nitride and a C layer made of TiSi nitride. The present invention was made based on the revealed fact.

Measures for Achieving the Object

The essence of the first invention is (a) a hard coating that is to be disposed to cover a surface of a substrate, wherein (b) the hard coating has a total thickness of 0.5-20 μm and includes an A layer and a nanolayer-alternated layer that are alternately laminated by physical vapor deposition, wherein the nanolayer-alternated layer includes a B layer and a C layer that are alternately laminated, (c) the A layer has a thickness of 50-1000 nm and is AlCr nitride that is represented by a composition formula of $[Al_{1-U}Cr_U]N$ wherein an atomic ratio U is 0.20-0.80, (d) the B layer has a thickness of 1-100 nm and is TiAl nitride that is represented by a composition formula of $[Ti_{1-W}Al_W]N$ wherein an atomic ratio W is 0.30-0.85, (e) the C layer has a thickness of 1-100 nm and is TiSi nitride that is represented by a composition formula of $[Ti_{1-Y}Si_Y]N$ wherein an atomic ratio Y is 0.05-0.45, and (f) the nanolayer-alternated layer has a thickness of 50-1000 nm.

The essence of the second invention is that a ratio $T_A/T_{NL}$ of the thickness $T_A$ of the A layer to a thickness $T_{NL}$ of the nanolayer-alternated layer is 0.2-10.

The essence of the third invention is that the A layer contains additive α that is at least one kind of element selected from a group consisting of Si, V, Y, Zr, Nb, Mo, Ta and W, such that a content ratio of the additive α is not larger than 20 at %.

The essence of the fourth invention is that the B layer contains additive β that is at least one kind of element selected from a group consisting of B, C, V, Cr, Zr, Nb, Mo, Hf, Ta and W, such that a content ratio of the additive β is not larger than 10 at %.

The essence of the fifth invention is that the C layer contains additive γ that is at least one kind of element selected from a group consisting of B, C, V, Y, Nb, Mo and W, such that a content ratio of the additive γ is not larger than 10 at %.

The essence of the sixth invention is that the hard coating is disposed to directly cover the substrate.

The essence of the seventh invention is that the hard coating is disposed to cover the substrate via an interface layer; and the interface layer has a thickness of 50-1000 nm, and is made of material substantially the same as material of the A layer, the B layer, the C layer or the nanolayer-alternated layer.

The essence of the eighth invention is that the substrate is covered partially or entirely with the hard coating according to any one of the first through seventh inventions.

Effect of the Invention

According to the first invention, the hard coating, which is to be coated on the surface of the substrate, has the total thickness of 0.5-20 μm and includes the A layer and the nanolayer-alternated layer that are alternately laminated by physical vapor deposition, wherein the nanolayer-alternated layer includes the B layer and the C layer that are alternately laminated. The A layer has the thickness of 50-1000 nm and is AlCr nitride that is represented by the composition formula of $[Al_{1-U}Cr_U]N$ wherein the atomic ratio U is 0.20-0.80. The B layer has the thickness of 1-100 nm and is TiAl nitride that is represented by the composition formula of $[Ti_{1-W}Al_W]N$ wherein the atomic ratio W is 0.30-0.85. The C layer has the thickness of 1-100 nm and is TiSi nitride that is represented by the composition formula of $[Ti_{1-Y}Si_Y]N$ wherein the atomic ratio Y is 0.05-0.45. The nanolayer-alternated layer has the thickness of 50-1000 nm. Thus, crystal grains of each layer are refined, whereby the coating strength is improved, and excellent oxidation resistance, high hardness and high tenacity are provided. Further, the construction of alternate lamination of the A layer and the nanolayer-alternated layer prevents progress of crack, whereby wear resistance and chipping resistance are improved. Consequently, it is possible to obtain a tool which provides wear resistance when being used to cut carbon steel, cast iron or the like, and which provides welding resistance when being used to cut alloy steel, stainless steel or the like.

According to the second invention, the ratio $T_A/T_{NL}$ of the thickness $T_A$ of the A layer to the thickness $T_{NL}$ of the nanolayer-alternated layer is 0.2-10. Thus, it is possible to obtain a tool which provides wear resistance when being used to cut carbon steel, cast iron or the like, and which provides welding resistance when being used to cut alloy steel, stainless steel or the like.

According to the third invention, the A layer contains the additive α that is at least one kind of element selected from the group consisting of Si, V, Y, Zr, Nb, Mo, Ta and W, such that the content ratio of the additive α is not larger than 20 at %. Thus, solid-solution strengthening is caused in the A layer whereby the hardness of the AlCr nitride can be increased, so that the strength is increased and an oxide is formed on the surface by increased temperature during a cutting operation, thereby providing excellent wear resistance and preferable balance of wear resistance to welding resistance, and accordingly resulting in long tool life.

According to the fourth invention, the B layer contains the additive β that is at least one kind of element selected from the group consisting of B, C, V, Cr, Zr, Nb, Mo, Hf, Ta and W, such that the content ratio of the additive β is not larger than 10 at %. Thus, solid-solution strengthening is caused in the B layer whereby the hardness of the TiAl nitride can be increased, thereby providing excellent wear resistance.

According to the fifth invention, the C layer contains the additive γ that is at least one kind of element selected from the group consisting of B, C, V, Y, Nb, Mo and W, such that the content ratio of the additive γ is not larger than 10 at %. Thus, solid-solution strengthening is caused in the C layer whereby the hardness of the TiSi nitride can be increased, thereby providing excellent wear resistance. Particularly, where the additive γ is at least one of V, Nb, Mo and W, an oxide is formed by increased temperature during a cutting operation, thereby providing self-lubricating function and accordingly leading to further increased tool life.

According to the sixth invention, the hard coating is disposed to directly cover the substrate. Thus, an interface layer is not required to be disposed between the hard coating and the substrate, whereby the production can be made easily.

According to the seventh invention, the hard coating is disposed to cover the substrate via the interface layer, and the interface layer has the thickness of 50-1000 nm, and is made of the material substantially the same as material of the A layer, the B layer, the C layer or the nanolayer-alternated layer. Thus, it is possible to further increase bonding strength between the heard coating and the substrate.

According to the eighth invention, in the hard-coating-covered tool, the substrate is covered partially or entirely with the hard coating according to any one of the first through seventh inventions. Thus, it is possible to obtain a tool which provides wear resistance when being used to cut carbon steel or cast iron, and which provides welding resistance when being used to cut alloy steel or stainless steel.

Preferably, the above-described hard-coating-covered tool is used as a rotary cutting tool such as drill and milling cutter, a non-rotary cutter such as lathe cutter, a non-cutting tool such as forming tap, rolling tool and press die, and any one of other various kinds of machining tools. However, the above-described hard-coating-covered tool does not necessarily have to be used as such a machining tool but may be used as any one of various kinds of wear-resistant hard-coating-covered member such as bearing member, which requires wear resistance and oxidation resistance.

Further, preferably, the hard coating of the present invention is formed by an arc ion plating, a PVD method such as ion-beam-assisted deposition and sputtering, and other physical vapor deposition.

Further, cemented carbide or high-speed tool steel is preferably used as the substrate that is to be covered with the hard coating of the present invention. However, any one of the other tool materials such as cermet, ceramics, polycrystalline diamond and polycrystalline CBN may be used as the substrate.

BRIEF DESCRIPTION OF DRAWINGS

FIG. 8 is a table showing kinds of constituent elements of AlCr nitride constituting A layers and a ratio of each of the constituent elements in test samples 1-50, which are different in kinds of constituent elements and a ratio of each of the constituent elements, kinds and composition ratios of additive and thickness of each of the A, B and C layers constituting the hard coating.

FIG. 9 is a table showing kinds of constituent elements and a ratio of each of the constituent elements of TiAl nitride constituting the B layers in the test samples 1-50 shown in FIG. 8.

FIG. 10 is a table showing kinds of constituent elements and a ratio of each of the constituent elements of TiSi nitride constituting the C layers in the test samples 1-50 shown in FIG. 8.

FIG. 11 is a table showing the thickness of each of the A layers, B layers and C layers, a number of pairs of the laminated B layers and C layers, a thickness of each of nanolayer-alternated layers, a thickness of an interface layer, a number of pairs of the laminated A layers and nanolayer-alternated layers, and a total thickness of the hard coating in the test samples 1-50 shown in FIG. 8.

FIG. 12 is a table showing a coating hardness, a wear width, a cutting distance and a judgement result in the test samples 1-50 shown in FIG. 8.

MODES FOR CARRYING OUT THE INVENTION

A hard coating as an embodiment of the present invention will now be described in detail with reference to the drawings.

Embodiment

Figure 1:
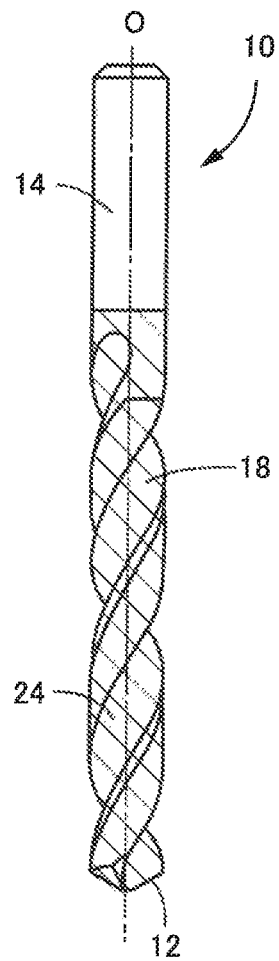
FIG. 1 is a front view showing a drill provided with a hard coating according to an embodiment of the present invention.
Figure 2:
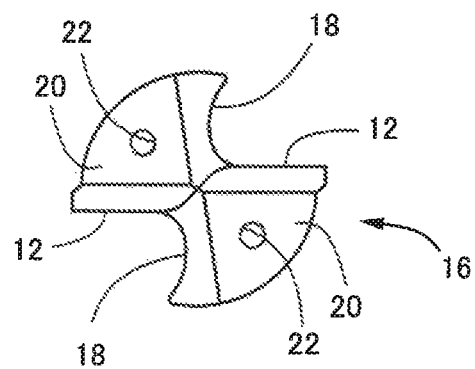
FIG. 2 is an enlarged bottom view as seen from a side of a distal end of the drill of FIG. 1, for explaining a construction of the drill.

FIGS. 1 and 2 are views showing a drill 10 as an example of a hard-coating-covered tool or a hard-coating-covered member, which is covered with a hard coating 24 of the present invention. FIG. 1 is the front view as seen in a direction perpendicular to an axis O of the drill 10. FIG. 2 is an enlarged bottom view as seen from a side of a distal end of the drill 10 in which cutting edges 12 are provided. This drill 10 is two-fluted twist drill, and includes a shank 14 and a body 16 which are axially contiguous to each other and which are formed integrally with each other. The body 16 has a pair of flutes 18 each of which is formed in the body 16 to be twisted about the axis O in a clockwise direction. The pair of cutting edges 12 are provided by axially distal ends of the respective flutes 18. The drill 10 is to be rotated in a clockwise direction as seen from a side of the shank 14, such that a workpiece is cut by the cutting edges 12 whereby a hole is formed in the workpiece while chips produced as a result of the cutting of the workpiece are evacuated from the hole toward the shank 14 via the flutes 18.

A pair of cutting-fluid lead-out holes 22 are provided to longitudinally extend through from an end face of the shank 14 through the shank 14 and the body 16, and open in respective flank faces 20 that are contiguous to the respective cutting edges 12 in a distal end of the body 16. In FIG. 1, a shaded area indicates a coated portion that is covered with a hard coating in the form of the hard coating 24. In the present embodiment, the drill 10 is covered at the body 16 as its part with the hard coating 24. However, the drill 10 may be covered in its entirety with the hard coating 24.

Figure 3:
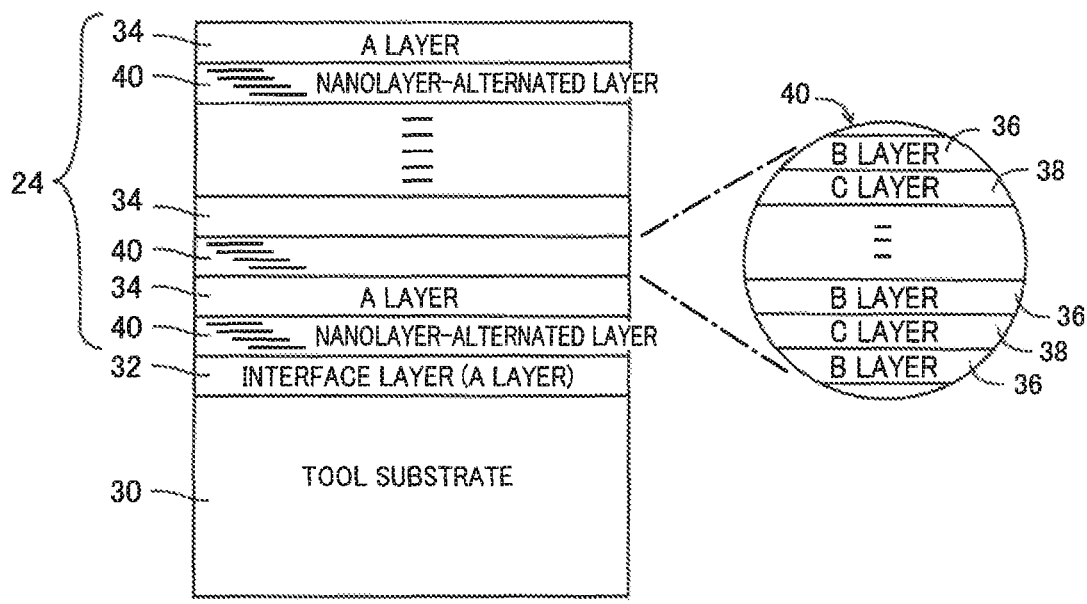
FIG. 3 is a schematic view of explaining an example of laminated structure of the hard coating that is provided to cover the drill of FIG. 1.

FIG. 3 is a schematic view showing, in enlargement, a cross section of the hard coating 24 of the drill 10. As shown in FIG. 3, the hard coating 24 is disposed on a tool substrate 30 made of, for example, cemented carbide, via an interface layer 32 that is formed by physical vapor deposition to have a thickness of about 50-1000 nm. The hard coating 24 is formed by physical vapor deposition, and is constituted by A layers 34 and nanolayer-alternated layers 40 as multi-layer areas. Each of the A layers 34 is formed to have a thickness of 50-1000 nm. Each of the nanolayer-alternated layers 40 is constituted by B layers 36 each having a thickness of 1-100 nm and C layers 38 each having a thickness of 1-100 nm. The B layers 36 and the C layers 38 are alternately laminated such that each of the nanolayer-alternated layers 40 has a thickness of 50-1000 nm. The A layers 34 and the nanolayer-alternated layers 40 are alternately laminated such that the hard coating 24 has a total thickness of 0.5-20 μm.

Each of the A layers 34 has the thickness of 50-1000 nm and is made of AlCr nitride that is represented by a composition formula of $[Al_{1-U}Cr_U]N$ wherein an atomic ratio U is 0.20-0.80. The AlCr nitride contains additive α that is constituted by at least one kind of element selected from a group consisting of Si, V, Y, Zr, Nb, Mo, Ta and W, such that the content ratio of the additive α is not larger than 20 at %. That is, each of the A layers 34 is AlCr nitride that is represented by a composition formula of $[Al_{1-U-V}Cr_U\alpha_V]N$ wherein the atomic ratio U is 0.20-0.80 and an atomic ratio V is 0-0.20. The additive α is characterized by causing solid-solution strengthening whereby the hardness of the AlCr nitride is increased, and causing a strength of the AlCr nitride to be increased and causing an oxide to be formed on the surface of the AlCr nitride by increased temperature during a cutting operation, thereby increasing ware resistance.

Each of the B layers 36 has the thickness of 1-100 nm and is made of TiAl nitride that is represented by a composition formula of $[Ti_{1-W}Al_W]N$ wherein an atomic ratio W is 0.30-0.85. The TiAl nitride contains additive β that is constituted by at least one kind of element selected from a group consisting of B, C, V, Cr, Zr, Nb, Mo, Hf, Ta and W, such that the content ratio of the additive β is not larger than 10 at %. That is, each of the B layers 36 is TiAl nitride that is represented by a composition formula of $[Ti_{1-W-X}Al_W\beta_X]N$ wherein the atomic ratio W is 0.30-0.85 and an atomic ratio X is 0-0.10. The additive β is characterized by causing solid-solution strengthening whereby the hardness of the TiAl nitride is increased, thereby contributing to increase of wear resistance.

Each of the C layers 38 has the thickness of 1-100 nm and is made of TiSi nitride that is represented by a composition formula of $[Ti_{1-Y}Si_Y]N$ wherein an atomic ratio Y is 0.05-0.45. The TiSi nitride contains additive γ that is constituted by at least one kind of element selected from a group consisting of B, C, V, Y, Nb, Mo and W, such that the content ratio of the additive γ is not larger than 10 at %. That is, each of the C layers 38 is TiSi nitride that is represented by a composition formula of $[Ti_{1-Y-Z}Si_Y\gamma_Z]N$ wherein the atomic ratio Y is 0.05~0.45 and an atomic ratio Z is 0-0.10. The additive γ is characterized by causing solid-solution strengthening whereby the hardness of the TiSi nitride is increased, thereby contributing to increase of wear resistance. Further, among the additive γ, V, Nb, Mo and W cause an oxide to be formed by increased temperature during a cutting operation, thereby providing self-lubricating function and accordingly contributing to increase of tool life.

The interface layer 32 is formed by physical vapor deposition similar to the physical vapor deposition by which the hard coating 24 is formed, so as to have a thickness of 50-1000 nm. The interface layer 32 may be made of the AlCr nitride constituting the A layers 34, the TiAl nitride constituting the B layers 36, the TiSi nitride constituting the C layers 38, or material (TiAl nitride/TiSi nitride) of nanolayer laminated structure substantially the same as the nanolayer-alternated layers 40. FIG. 3 shows an example where the interface layer 32 is made of material substantially the same as the A layers 34, namely, is made of AlCr nitride. In each of the nanolayer-alternated layers 40, a lamination number of the B and C layers 36, 38 may be either an even number or an odd number that is not smaller than 3. Further, in each of the nanolayer-alternated layers 40, an uppermost layer or a lowermost layer may be either the B layer 36 or C layer 38. In the hard coating 24, a lamination number of the A and nanolayer-alternated layers 34, 40 may be either an even number or an odd number that is not smaller than 3. Further, in the hard coating 24, an uppermost layer or a lowermost layer maybe either the A layer 34 or nanolayer-alternated layer 40.

Figure 4:
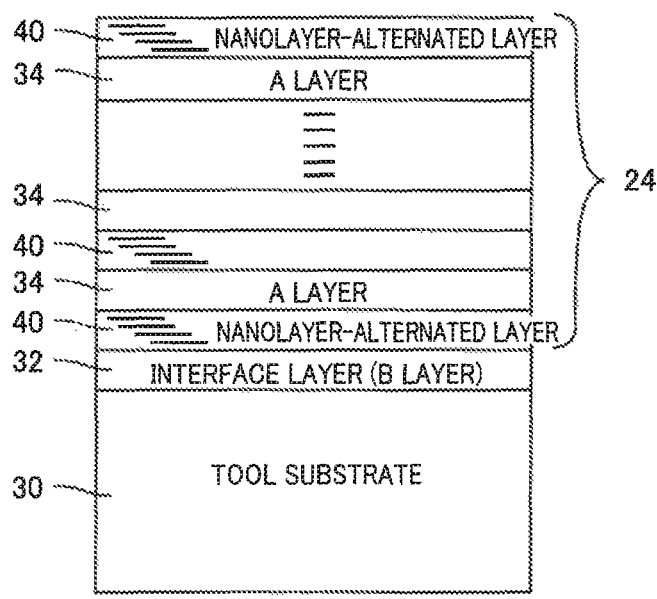
FIG. 4 is a schematic view of explaining another example of laminated structure of the hard coating that is provided to cover the drill of FIG. 1.
Figure 5:
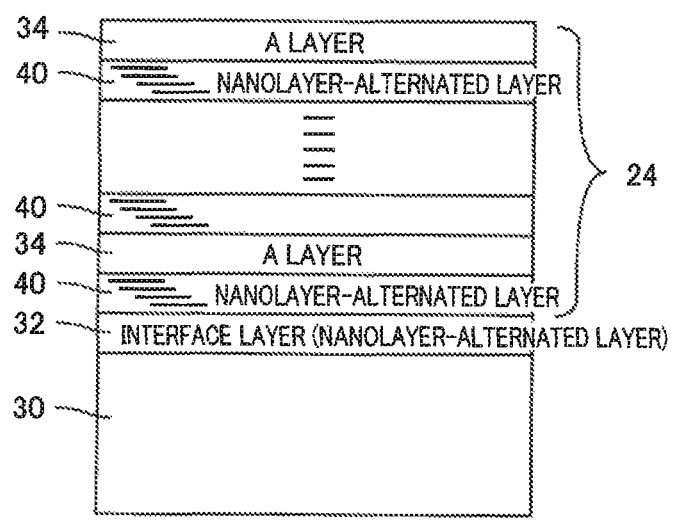
FIG. 5 is a schematic view of explaining still another example of laminated structure of the hard coating that is provided to cover the drill of FIG. 1.
Figure 6:
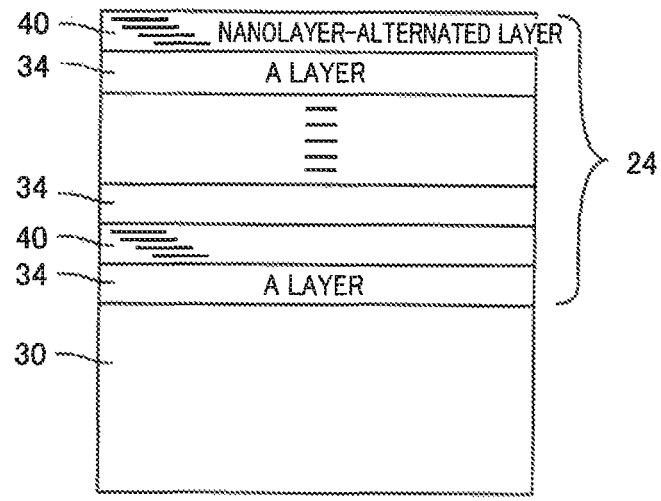
FIG. 6 is a schematic view of explaining further example of laminated structure of the hard coating that is provided to cover the drill of FIG. 1.

FIGS. 4, 5 and 6 show constructions of respective other examples of the hard coating 24. The hard coating 24 of FIG. 4 is different from that of FIG. 3 in that the lamination number of the A and nanolayer-alternated layers 34, 40 is an odd number, in that the lamination number of the B and C layers 36, 38 in each of the nanolayer-alternated layers 40 is an odd number; and in that the interface layer 32 is made of TiAl nitride that is substantially the same as the material of the B layers 36. The hard coating 24 of FIG. 5 is different from that of FIG. 3 in that the interface layer 32 disposed between the tool substrate 30 and the hard coating 24 is made of material (TiAl nitride/TiSi nitride) of nanolayer laminated structure substantially the same as the material of the nanolayer-alternated layers 40. The hard coating 24 of FIG. 6 is different from that of FIG. 3 in that the uppermost layer of the hard coating 24 is constituted by the nanolayer-alternated layer 40, and in that the hard coating 24 is disposed directly on the tool substrate 30 without via the interface layer 32.

Figure 7:
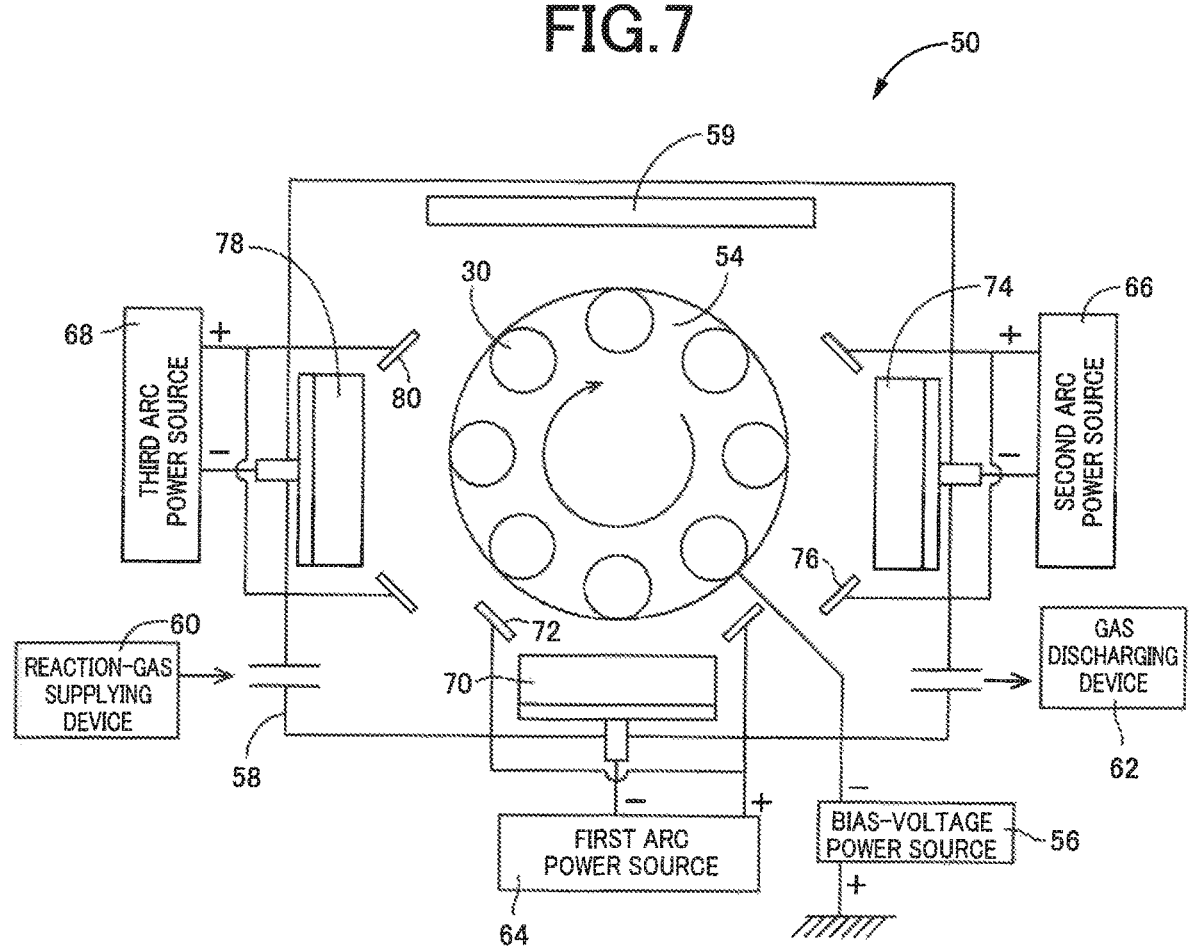
FIG. 7 is a schematic view of explaining an arc ion plating apparatus as an example of a physical vapor deposition apparatus for forming the hard coating of FIG. 1 on a tool substrate.

FIG. 7 is a schematic construction view (schematic view) of explaining an arc ion plating apparatus 50 that is used for manufacturing the drill 10. The arc ion plating apparatus 50 is operated to form the interface layer 32, A layers 34, B layers 36 and C layers 38 by an arc ion plating as a kind of physical vapor deposition such that these layers 32, 34, 36, 38 are deposited on the tool substrate 30 that has a shape substantially the same as the drill 10 shown in FIGS. 1 and 2.

The arc ion plating apparatus 50 includes; for example, a rotary table 54 to be driven to be rotated about a rotation axis extending substantially in a vertical direction and to hold a plurality of workpieces, i.e., the plurality of tool substrates 30 each of which is not yet covered with the hard coating 24 and has the cutting edges 12 and flutes 18 already formed therein; a bias-voltage power source 56 for applying a negative bias voltage to the tool substrates 30; a processing vessel in the form of a chamber 58 which accommodates therein the tool substrates 30; a heater 59 provided in the chamber 58; a reaction-gas supplying device 60 for supplying a reaction gas into the chamber 58; a gas discharging device 62 for discharging a gas from an interior of the chamber 58 by, for example, a vacuum pump so as to reduce a pressure in the interior of the chamber 58; a first arc power source 64; a second arc power source 66 and a third arc power source 68. The rotary table 54 is a cylindrical-shaped or polygonal-prism-shaped table whose center corresponds to the above-described rotation axis. The plurality of tool substrates 30 are held in an outer peripheral portion of the rotary table 54 such that each of the tool substrates 30 has an attitude that causes its distal end protrudes upwardly. The reaction-gas supplying device 60 is equipped with a tank in which argon gas (Ar) is stored and also a tank in which nitrogen gas is stored, for supplying the nitrogen gas when the interface layer 32, A layers 34, B layers 36 and C layers 38 are to be formed.

Each of the first arc power source 64; second arc power source 66 and third arc power source 68 is configured to selectively energize between a corresponding one of anodes 72, 76, 80 and a corresponding one of cathodes in the form of first evaporation source 70, second evaporation source 74 and third evaporation source 78 that are made of vapor deposition material, with an arc current, thereby selectively causing evaporation material to evaporate from the corresponding one of the first evaporation source 70, second evaporation source 74 and third evaporation source 78. After having being evaporated, the evaporation material becomes positive ion that is deposited to cover the tool substrate 30 to which negative (−) bias voltage is applied. It is set such that the first arc power source 64, second arc power source 66 and third arc power source 68 are selected to evaporate a prescribed composition for obtaining each of the interface layer 32, A layers 34, B layers 36 and C layers 38 The arc current and the bias voltage are determined. Further, a coating forming condition such as temperature of 400-550° C. and vacuum degree of 2-10 Pa is determined. The thickness of each of the interface layer 32, A layers 34, B layers 36 and C layers 38 is adjusted by controlling a length of time for the coating formation.

For example, the first evaporation source 70 is constituted by AlCr nitride that is represented by a composition formula of $[Al_{1-U}Cr_{U}]N$ wherein an atomic ratio U is 0.20-0.80 such that the AlCr nitride contains the additive $\alpha$ such that a content ratio of the additive $\alpha$ is not larger than 20 at %. The second evaporation source 74 is constituted by TiAl nitride that is represented by a composition formula of $[Ti_{1-W}Al_{W}]N$ wherein an atomic ratio W is 0.30~0.85 such that the TiAl nitride contains the additive $\beta$ such that a content ratio of the additive $\beta$ is not larger than 10 at %. The third evaporation source 78 is constituted by TiSi nitride that is represented by a composition formula of $[Ti_{1-Y}Si_{Y}]N$ wherein an atomic ratio Y is 0.05~0.45 such that the TiSi nitride contains the additive $\gamma$ such that a content ratio of the additive $\gamma$ is not larger than 10 at %. When the interface layer 32 is to be formed on the tool substrate 30, the AlCr nitride is evaporated from the first evaporation source 70 by the first arc power source 64, or the TiAl nitride is evaporated from the second evaporation source 74 by the second arc power source 66. When each of the A layers 34 is to be formed on the tool substrate 30, the AlCr nitride is evaporated from the first evaporation source 70 by the first arc power source 64. When each of the nanolayer-alternated layers 40 is to be formed on the tool substrate 30, terms in which the TiAl nitride is evaporated from the second evaporation source 74 by the second arc power source 66 and terms in which the TiSi nitride is evaporated from the third evaporation source 78 by the third arc power source 68 are alternately provided whereby the B layers 34 of nano-order constituted by the TiAl nitride and the C layers 36 of nano-order constituted by the TiSi nitride are alternately laminated. With these operations being selectively carried out, the hard coating 24 shown in FIG. 3 is disposed on the tool substrate 30, for example.

For checking wear resistance and welding resistance, the present inventors prepared 50 kinds of test samples 1-50 in each of which the hard coating 24 shown in FIG. 3 is formed on the tool substrate 30 having substantially the same shape as the drill 10 shown in FIGS. 1 and 2 and made of cemented carbide, by using the arc ion plating apparatus 50 of FIG. 7. The test samples 1-50 are different from one another, as shown in FIGS. 8, 9, 10 and 11, in terms of the composition ratios (at %) and thickness (nm) of the interface layer 32, A layers 34, B layers 36 and C layers 38, the number of pairs of the laminated B and C layers 36, 38 in each of the nanolayer-alternated layers 40, the thickness of each of the nanolayer-alternated layers 40 and the number of pairs of the laminated A and nanolayer-alternated layers 34, 40. Then, the present inventors measured the coating hardness of each of the test samples 1-50 in accordance with a coating-hardness (Vickers hardness) measuring method described below, and measured the wear width and the cutting distance when a cutting is made by each of the test samples 1-50 in accordance with a cutting test condition, so as to evaluate a cutting performance. FIG. 12 shows result of the evaluation. It is noted that a unit of composition values shown in FIGS. 8, 9 and 10 is at % (atomic %).

(Coating-Hardness Measuring Method)

In accordance with Vickers hardness test method (JISG0202, Z2244), the HV value (Vickers hardness) of the hard coating of each of the test samples 1-50 was measured under a condition indicated by hardness symbol HV0.025.

(Cutting Test Condition)

Workpiece material: S50C
Cutting speed: 100m/min.
Rotating speed: 5305 min$^{-1}$
Feed rate: 0.18 mm/rev.
Cutting depth: 30 mm (blind hole)
Step feed amount: Non-step feed
Cutting fluid: Water-soluble cutting fluid (Wear-Width Measuring Method)

The drilling was repeated until the cutting distance of the cutting edges of the distal end of the drill reached 50 m. Then, when the cutting distance reached 50 m, the wear width of the coating in the flank face in the distal end portion of the drill, namely, the width of exposure of the substrate in portions adjacent to the cutting edges was actually measured by using a stereoscopic microscope with scale. The measured wear width is shown at *1 in FIG. 12.

(Cutting-Distance Measuring Method and Judging Method)

The cutting distance of the cutting edges of the distal end of the drill was calculated based on the cutting test condition (rotating speed: 5305 min$^{-1}$, feed rate: 0.18 mm/rev, cutting depth: 30 mm) and the number of machined holes (total cutting distance) until the wear width of the drill reached 0.2 mm. The calculated cutting distance is shown at *2 in FIG. 12. Those having the cutting distance shorter 50 m were judged unacceptable, and are indicated with "X" mark at *3 in FIG. 12. Those having the cutting distance not shorter 50 m were judged acceptable, and are indicated with "O" mark at *3 in FIG. 12.

As shown in FIG. 12, the coating hardness of the test samples 7-50 corresponding to the embodiments of the present invention was 2990-3490 (HV0.025), and was higher than the coating hardness of the test samples 1-6 according to comparative examples.

Further, as shown in FIG. 12, the test samples 1-6 corresponding to the comparative examples were judged unacceptable, since the cutting distance until the wear width reached 0.2 mm was smaller than 50m as an acceptable minimum value. In the test sample 1, there are not provided the nanolayer-alternated layers 40 each of which is an alternated layer of the B and C layers 36, 38, and the thickness of the interface layer 32 is larger than 1000 nm. In the test sample 2, the thickness of each of the A layers 34 is larger than 1000 nm. In the test sample 3, there are not provided the A layers 34, the thickness $T_B$ of each of the B layers 36 and the thickness $T_C$ of each of the C layers 38 are larger than 100 nm, the thickness of each of the nanolayer-alternated layers 40 is larger than 1000 nm, and the total thickness is larger than 20 μm. In the test sample 4, the thickness $T_A$ of each of the A layers 34 is so small and smaller than 50 nm, and the thickness of the interface layer 32 is larger than 1000 nm. In the test sample 5, there are not provided the A layers 34, and the thickness $T_B$ of each of the B layers 36 is so small and smaller than 1 nm. In the test sample 6, the thickness $T_A$ of each of the A layers 34 is so small and smaller than 50 nm, the thickness $T_B$ of each of the B layers 36 and the thickness $T_C$ of each of the C layers 38 are smaller than 1 nm, the thickness of the interface layer 32 is smaller than 50 nm, and the total thickness is smaller than 0.5 μm.

However, the test samples 7-50 corresponding to the embodiments of the invention were judged acceptable, since the cutting distance until the wear width reached 0.2 mm was not smaller than 50 m as the acceptable minimum value. It is noted that substantially the same results as those shown in FIG. 12 were obtained also in the drills shown in FIGS. 4-6. In the drill of FIG. 4, the uppermost layer of the hard coating 24 is the nanolayer-alternated layer 40 and the lamination number of the hard coating 24 is an odd number. The drill of FIG. 5 is substantially the same as the drill of FIG. 3 except that the interface layer 32 is made of material substantially the same as material of the nanolayer-alternated layers 40. In the drill of FIG. 6, there is not provided the interface layer 32, the lamination number of the hard coating 24 is an even number and the lamination number of each of the nanolayer-alternated layers 40 is an even number. That is, substantially the same results as those shown in FIG. 12 were obtained irrespective of whether the interface layer 32 is present or absent, irrespective of whether the uppermost layer or lowermost layer of the hard coating 24 is the A layer 34 or nanolayer-alternated layer 40, irrespective of whether the lamination number of the hard coating 24 is an odd number or an even number, and irrespective of whether the lamination number of each of the nanolayer-alternated layers 40 is an odd number or an even number.

In the test samples 7-50 shown in FIG. 12 and corresponding to the embodiments of the invention, the composition of the A layers 34 is such that a content ratio of Al is 20-80 at %, a content ratio of Cr is 80-20 at %, and the additive α is constituted by Si, V, Y, Zr, Nb, Mo, Ta and/or W and a content ratio of the additive α is 0-20 at %, for example, as shown in the test samples 7 and 13 of FIG. 8. That is, the preferable composition of the A layers 34 is AlCr nitride represented by the composition formula of [Al$_{1-U-V}$Cr$_U$α$_V$]N wherein the atomic ratio U is 0.20-0.80 and the atomic ratio V is 0-0.20. The thickness $T_A$ of each of the A layers 34 is preferably 50-1000 nm, for example, as shown in the test samples 7 and 15 of FIG. 11.

In the test samples 7-50 shown in FIG. 12 and corresponding to the embodiments of the invention, the composition of the B layers 36 is such that a content ratio of Ti is 15-70 at %, a content ratio of Al is 85-30 at %, and the additive β is constituted by at least one kind of element of B, C, V, Cr, Zr, Nb, Mo, Hf, Ta and W and a content ratio of the additive β is 0-10 at %, for example, as shown in the test samples 8 and 22 of FIG. 9. That is, the preferable composition of the B layers 36 is TiAl nitride represented by the composition formula of [Ti$_{1-w-x}$Al$_W$β$_X$]N wherein the atomic ratio W is 0.30-0.85 and the atomic ratio X is 0-0.10. The thickness $T_B$ of each of the B layers 36 is preferably 1-100 nm, for example, as shown in the test samples 15 and 25 of FIG. 11.

In the test samples 7-50 shown in FIG. 12 and corresponding to the embodiments of the invention, the composition of the C layers 38 is such that a content ratio of Ti is 55-94.5 at %, a content ratio of Si is 5-45 at %, and the additive γ is constituted by at least one kind of element of B, C, V, Y, Nb, Mo and W and a content ratio of the additive γ is 0-10 at %, for example, as shown in the test samples 14 and 16 of FIG. 10. That is, the preferable composition of the C layers 38 is TiSi nitride represented by the composition formula of $[Ti_{1-Y-Z}Si_Y\gamma]N$ wherein the atomic ratio Y is 0.05-0.45 and the atomic ratio Z is 0-0.10. The thickness $T_C$ of each of the C layers 38 is preferably 1-100 nm, for example, as shown in the test samples 14 and 15 of FIG. 11.

In the test samples 7-50 shown in FIG. 12 and corresponding to the embodiments of the invention, the thickness of each of the nanolayer-alternated layers 40 is 50-1000 nm, for example, as shown in the test sample 7, 27 and 28 of FIG. 11. Further, a ratio $T_A/T_{NL}$ of the thickness $T_A$ of each of the A layers 34 to the thickness $T_{NL}$ of each of the nanolayer-alternated layers 40 is 0.2-10.

In the test samples 7-50 shown in FIG. 12 and corresponding to the embodiments of the invention, the thickness of the interface layer 32 is 50-1000 nm, for example, as shown in the test samples 10 and 11 of FIG. 11.

In the test samples 7-50 shown in FIG. 12 and corresponding to the embodiments of the invention, the total thickness of the hard coating 24 is 0.5-20 μm, for example, as shown in the test samples 7 and 25 of FIG. 11.

In the test samples 7-50 shown in FIG. 12 and corresponding to the embodiments of the invention, the number of repeat in each of the nanolayer-alternated layers 40 in which the B and C layers 36, 38 are laminated, i.e., the number of pairs of the laminated B and C layers 36, 38 in each of the nanolayer-alternated layers 40 is 1-100, for example, as shown in the test samples 27 and 43. Further, the number of repeat in the hard coating 24 in which the A and nanolayer-alternated layers 34, 40 are laminated, i.e., the number of pairs of the laminated A and nanolayer-alternated layers 34, 40 in the hard coating 24 is 2-199, for example, as shown in the test samples 7 and 15.

Figure 13:
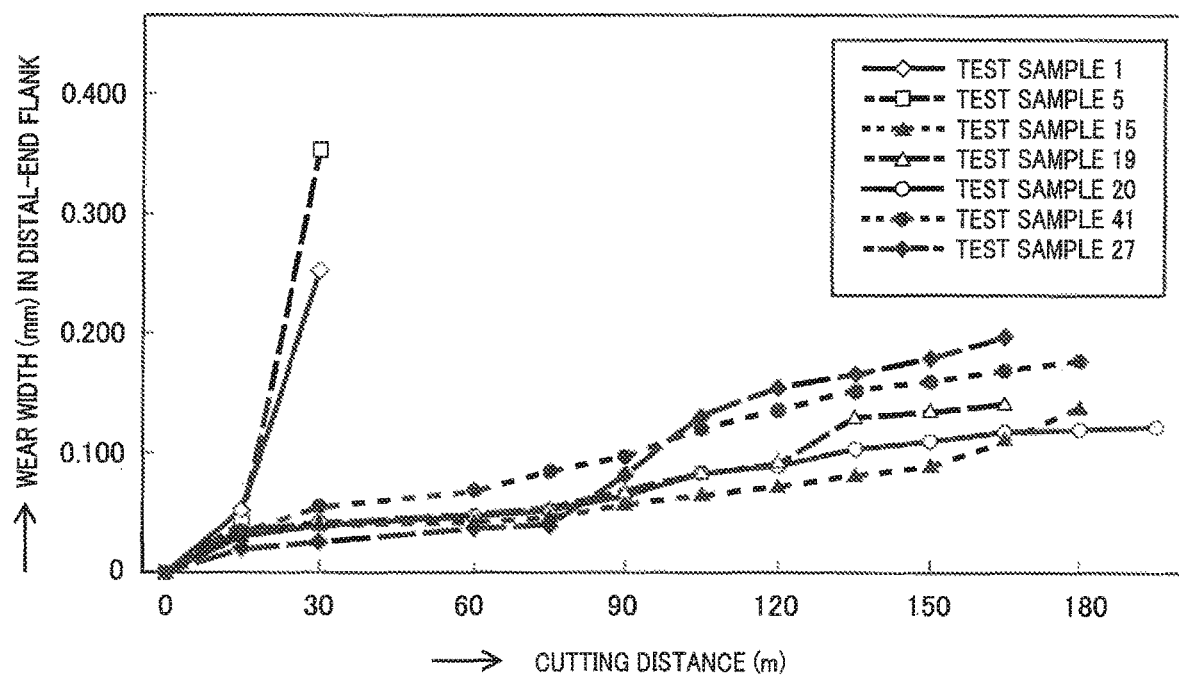
FIG. 13 is a view showing characteristics of increase of the wear width, which was caused with increase of the cutting distance in the test samples 1, 5, 15, 19, 20, 41 and 27 of the test samples 1-50 shown in FIG. 8.

FIG. 13 is a view showing characteristics of increase of the wear width, which was caused with increase of the cutting distance in the test samples 1 and 5 corresponding to the comparative examples and the test samples 15, 19, 20, 41 and 27 corresponding to the embodiments of the invention in the above-described cutting test. A rate of increase of the wear width in the test samples 1 and 5 corresponding to the comparative examples is considerably large as compared with that in the test samples 15, 19, 20, 41 and 27 corresponding to the embodiments of the invention.

According to the present embodiment, the hard coating 24, which is to be disposed to cover the surface of the tool substrate 30, has the total thickness of 0.5-20 μm, and consists of the A layers 34 and the nanolayer-alternated layers 40 that are alternately laminated by physical vapor deposition, wherein each of the nanolayer-alternated layers 40 consists of the B layers 36 and the C layers 38 that are alternately laminated. Each of the A layers 34 has the thickness of 50-1000 nm and is AlCr nitride that is represented by the composition formula of $[Al_{1-U}Cr_U]N$ wherein the atomic ratio U is 0.20-0.80. Each of the B layers 36 has the thickness of 1-100 nm and is TiAl nitride that is represented by the composition formula of $[Ti_{1-W}Al_W]N$ wherein the atomic ratio W is 0.30-0.85. Each of the C layers 38 has the thickness of 1-100 nm and is TiSi nitride that is represented by the composition formula of $[Ti_{1-Y}Si_Y]N$ wherein the atomic ratio Y is 0.05-0.45. Each of the nanolayer-alternated layers 40 has the thickness of 50-1000 nm. Consequently, it is possible to obtain the drill 10 which provides wear resistance when being used to cut carbon steel, cast iron or the like, and which provides welding resistance when being used to cut alloy steel, stainless steel or the like.

According to the present embodiment, the ratio $T_A/T_{NL}$ of the thickness $T_A$ of each of A layers 34 to the thickness $T_{NL}$ of each of the nanolayer-alternated layers 40 is 0.2-10. Thus, it is possible to obtain a tool which provides wear resistance when being used to cut carbon steel, cast iron or the like, and which provides welding resistance when being used to cut alloy steel, stainless steel or the like.

According to the present embodiment, each of the A layers 34 contains the additive α that is at least one kind of element selected from the group consisting of Si, V, Y, Zr, Nb, Mo, Ta and W, such that the content ratio of the additive α is not larger than 20 at %. Thus, solid-solution strengthening is caused in each of the A layers 34 whereby the hardness of the AlCr nitride can be increased, so that the strength is increased and an oxide is formed on the surface by increased temperature during a cutting operation, thereby providing excellent wear resistance and preferable balance of wear resistance to welding resistance, and accordingly resulting in long tool life of the drill 10.

According to the present embodiment, each of the B layers 36 contains the additive β that is at least one kind of element selected from the group consisting of B, C, V, Cr, Zr, Nb, Mo, Hf, Ta and W, such that the content ratio of the additive β is not larger than 10 at %. Thus, solid-solution strengthening is caused in each of the B layers 36 whereby the hardness of the TiAl nitride can be increased, thereby providing excellent wear resistance of the drill 10.

According to the present embodiment, each of the C layers 38 contains the additive γ that is at least one kind of element selected from the group consisting of B, C, V, Y, Nb, Mo and W, such that the content ratio of the additive γ is not larger than 10 at %. Thus, solid-solution strengthening is caused in each of the C layers 38 whereby the hardness of the TiSi nitride can be increased, thereby providing excellent wear resistance of the drill 10. Particularly, where the additive γ is at least one of V, Nb, Mo and W, an oxide is formed by increased temperature during a cutting operation, thereby providing self-lubricating function and accordingly leading to further increased tool life of the drill 10.

According to the present embodiment, the hard coating 24 shown in FIG. 6 is disposed to directly cover the tool substrate 30. Thus, an interface layer is not required to be disposed between the hard coating 24 and the tool substrate 30, whereby the production can be made easily.

According to the present embodiment, the hard coating 24 shown in FIGS. 3, 4 and 5 is disposed to cover the tool substrate 30 via the interface layer 32, and the interface layer 32 has the thickness of 50-1000 nm, and is made of the material substantially the same as material of the A layers 34, B layers 36 or nanolayer-alternated layers 40. Thus, it is possible to further increase bonding strength between the heard coating 24 and the tool substrate 30.

According to the present embodiment, the drill 10 is a hard-coating-covered tool is covered partially with the hard coating 24. Thus, it is possible to provide wear resistance when the drill 10 is used to cut carbon steel, cast iron or the like, and provide welding resistance when the drill 10 is used to cut alloy steel, stainless steel or the like.

While the embodiment of the present invention has been described in detail by reference to the accompanying drawings, it is to be understood that the described embodiment is merely an embodied form and that the present invention can be embodied with various modifications and improvements on the basis of knowledge of those skilled in the art.

DESCRIPTION OF REFERENCE SIGNS

10: Drill (Hard-coating-covered tool, Hard-coating-covered member), 30: Tool substrate (substrate), 24: Hard coating, 34: A layers, 36: B layers, 38: C layers, 40: nanolayer-alternated layers

The invention claimed is:

1. A hard coating that is to be disposed to cover a surface of a substrate, said hard coating having a total thickness of 0.5-20 μm and comprising:
   an A layer and a nanolayer-alternated layer that are alternately laminated by physical vapor deposition, said nanolayer-alternated layer including a B layer and a C layer that are alternately laminated,
   wherein:
   said A layer has a thickness $T_A$ of 50-1000 nm and is AlCr nitride that is represented by a composition formula of $[Al_{1-U}Cr_U]N$, where U represents an atomic ratio in a range of 0.20-0.80,
   said B layer has a thickness $T_B$ of 1-100 nm and is TiAl nitride that is represented by a composition formula of $[Ti_{1-W}Al_W]N$, where W represents an atomic ratio in a range of 0.30-0.85,
   said C layer has a thickness $T_C$ of 1-100 nm and is TiSi nitride that is represented by a composition formula of $[Ti_{1-Y}Si_Y]N$, where Y represents an atomic ratio in a range of 0.05-0.45, and
   said nanolayer-alternated layer has a thickness $T_{NL}$ of 50-1000 nm.

2. The hard coating according to claim 1, wherein a ratio $T_A/T_{NL}$ of the thickness $T_A$ of said A layer to the thickness $T_{NL}$ of said nanolayer-alternated layer is 0.2-10.

3. The hard coating according to claim 1, wherein said A layer contains additive α that is at least one element selected from the group consisting of Si, V, Y, Zr, Nb, Mo, Ta and W, such that a content ratio of said additive α is not larger than 20 at %.

4. The hard coating according to claim 1, wherein said B layer contains additive β that is at least one element selected from the group consisting of B, C, V, Cr, Zr, Nb, Mo, Hf, Ta and W, such that a content ratio of said additive β is not larger than 10 at %.

5. The hard coating according to claim 1, wherein said C layer contains additive γ that is at least one element selected from the group consisting of B, C, V, Y, Nb, Mo and W, such that a content ratio of said additive γ is not larger than 10 at %.

6. The hard coating according to claim 1, wherein said hard coating is disposed to directly cover the substrate.

7. The hard coating according to claim 1, wherein
   said hard coating is disposed to cover the substrate via an interface layer, and
   said interface layer has a thickness of 50-1000 nm, and is made of material substantially the same as the material of said A layer, said B layer, said C layer or said nanolayer-alternated layer.

8. A hard-coating-covered member comprising said substrate covered partially or entirely with said hard coating according to claim 1.

9. The hard coating according to claim 1, wherein said A layer and said B layer are the AlCr nitride and the TiAl nitride, respectively, which are represented by the respective composition formulas that are different from each other, and are different from each other in terms of main constituent elements.

10. The hard coating according to claim 1, wherein one of said A layer, said B layer, and said C layer constitutes an uppermost layer of the hard coating.

11. The hard coating according to claim 1, wherein:
    said A layer contains additive α that is at least one element selected from the group consisting of Si, V, Y, Zr, Nb, Mo, Ta, and W, such that a content ratio of said additive α is not larger than 20 at %;
    said B layer contains additive β that is at least one element selected from the group consisting of B, C, V, Cr, Zr, Nb, Mo, Hf, Ta, and W, such that a content ratio of said additive β is not larger than 10 at %; and
    said C layer contains additive γ that is at least one element selected from the group consisting of B, C, V, Y, Nb, Mo, and W, such that a content ratio of said additive γ is not larger than 10 at %.

\* \* \* \* \*